United States Patent
Yamaguchi et al.

(10) Patent No.: US 8,304,795 B2
(45) Date of Patent: Nov. 6, 2012

(54) SEMICONDUCTOR LIGHT EMITTING DEVICE WITH CONCAVE-CONVEX PATTERN AND METHOD FOR MANUFACTURING THE SAME

(75) Inventors: Atsushi Yamaguchi, Kyoto (JP); Ken Nakahara, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 476 days.

(21) Appl. No.: 12/087,173

(22) PCT Filed: Dec. 28, 2006

(86) PCT No.: PCT/JP2006/326216
§ 371 (c)(1),
(2), (4) Date: Jun. 27, 2008

(87) PCT Pub. No.: WO2007/074897
PCT Pub. Date: Jul. 5, 2007

(65) Prior Publication Data
US 2009/0026475 A1    Jan. 29, 2009

(30) Foreign Application Priority Data
Dec. 29, 2005 (JP) ................... 2005-380682

(51) Int. Cl.
*H01L 33/00* (2010.01)

(52) U.S. Cl. ............. 257/98; 257/97; 257/E33.067; 438/29

(58) Field of Classification Search ........... 438/29; 257/97, 79, 29, E33.067, 98
See application file for complete search history.

(56) References Cited

U.S. PATENT DOCUMENTS

| 5,955,749 | A  | 9/1999  | Joannopoulos et al. |
| 6,495,862 | B1 | 12/2002 | Okazaki et al. |
| 2003/0178626 | A1* | 9/2003 | Sugiyama et al. ............. 257/79 |

(Continued)

FOREIGN PATENT DOCUMENTS
EP    1 909 335 A1    4/2008
(Continued)

OTHER PUBLICATIONS

Chiao-Chih Yang et al., "Improvement in Extraction Efficiency of GaN-Based Light-Emitting Diodes with Textured Surface Layer by Natural Lithography" Japanese Journal of Applied Physics, vol. 44, No. 4B, pp. 2525-2527, Apr. 2005.

A. Darwish et al., "Lasing and Intermode Correlation of Whispering Gallery Mode in Dye-doped Polystyrene Microspheres" Proceedings of SPIE, vol. 2852, pp. 177-188, 1996.

(Continued)

*Primary Examiner* — N Drew Richards
*Assistant Examiner* — John P Dulka
(74) *Attorney, Agent, or Firm* — Rabin & Berdo, P.C.

(57) ABSTRACT

A semiconductor lamination portion (6) is formed by laminating nitride semiconductor layers including an n-type layer (3) and a p-type layer (5) on one side of a substrate (1) so as to form a light emitting layer, and a light transmitting conductive layer (7) is provided at a surface side of the semiconductor lamination portion. A concave-convex pattern, i.e., concaves (7a), is provided on a surface of the light transmitting conductive layer. A p-side electrode (8) is provided on the light transmitting conductive layer, and an n-side electrode (9) is electrically connected to the n-type layer exposed by etching a part of the semiconductor lamination portion. Light emitted from the light emitting layer is therefore totally reflected repeatedly in the semiconductor lamination portion and the substrate and can be effectively taken out without attenuation, so external quantum efficiency can be improved.

7 Claims, 5 Drawing Sheets

U.S. PATENT DOCUMENTS

| | | | |
|---|---|---|---|
| 2004/0124422 A1 | 7/2004 | Sakamoto et al. | |
| 2004/0206969 A1* | 10/2004 | Orita | 257/97 |
| 2005/0189558 A1* | 9/2005 | Liu | 257/100 |
| 2005/0277218 A1* | 12/2005 | Nakajo et al. | 438/46 |
| 2006/0270206 A1 | 11/2006 | Cho et al. | |
| 2007/0082418 A1* | 4/2007 | Wuu et al. | 438/22 |

FOREIGN PATENT DOCUMENTS

| | | |
|---|---|---|
| JP | 2000-196152 | 7/2000 |
| JP | 2003-224297 A | 8/2003 |
| JP | 2005-005679 | 1/2005 |
| WO | WO-2006/132013 A | 12/2006 |

OTHER PUBLICATIONS

Shyi-Ming Pan et al., "Improvement of InGaN-GaN Light-Emitting Diodes With Surface-Textured Indium-Tin-Oxide Transparent Ohmic Contacts" IEEE Photonics Technology Letters, vol. 15, No. 5, pp. 649-651, May 2003.

R. H. Horng et al., "GaN-based light-emitting diodes with indium tin oxide texturing window layers using natural lithography" Applied Physics Letters, vol. 86, 2005.

Ray-Hua Horng et al., "Efficiency Improvement of GaN-Based LEDs with ITO Texturing Window Layers Using Natural Lithography" IEEE Journal of Selected Topics in Quantum Electronics, vol. 12, No. 6, pp. 1196-1201, Nov. 2006.

* cited by examiner (a)

(b)

(a)

(b)

(c)

(d)

(e)

(f)

(g)

(h)

(i)

(j)

F I G. 4
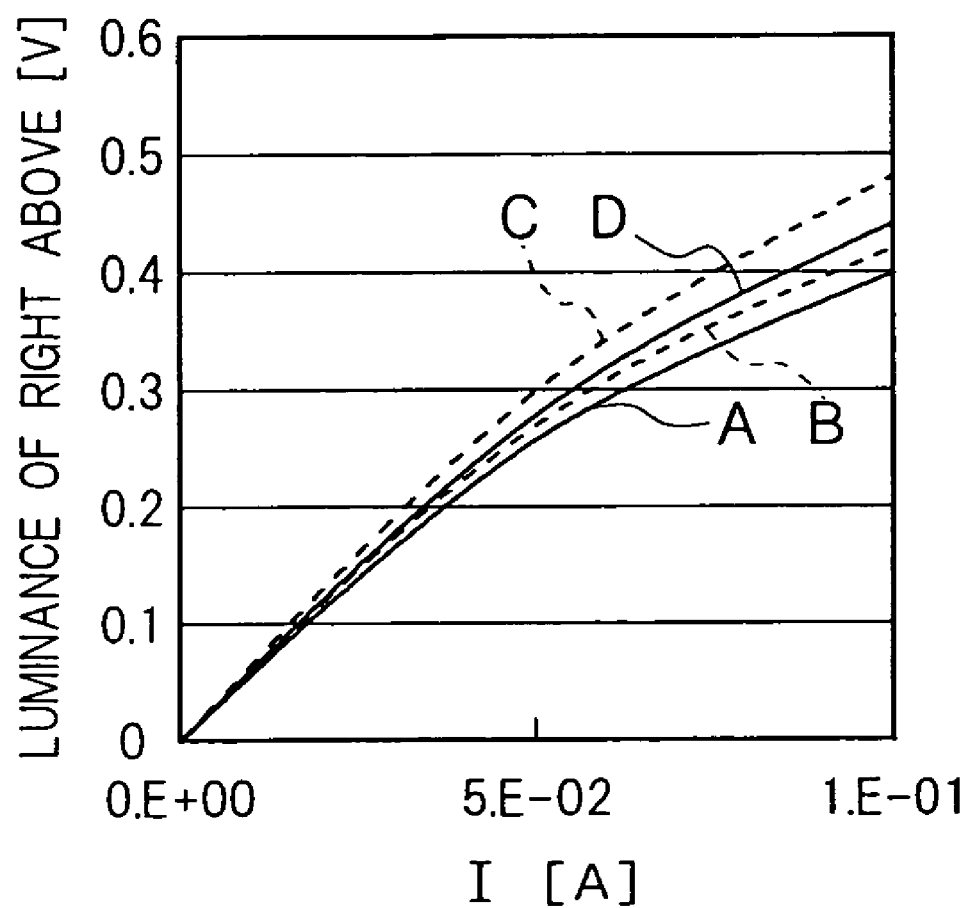

(a)

(b)

(c)

SEMICONDUCTOR LIGHT EMITTING DEVICE WITH CONCAVE-CONVEX PATTERN AND METHOD FOR MANUFACTURING THE SAME

FIELD OF THE INVENTION

The present invention relates to a semiconductor light emitting device, in which nitride semiconductor layers are laminated on a substrate, emitting blue light (from ultraviolet light to yellow light) and a method for manufacturing the same. More particularly, the present invention relates to a semiconductor light emitting device having a structure capable of taking out light emitted in a light emitting layer forming portion efficiently and improving external quantum efficiency, and relates to a method for manufacturing the same.

BACKGROUND OF THE INVENTION

As shown, for example, in FIG. 7, a semiconductor light emitting device emitting blue light by the prior art is formed by forming a semiconductor lamination portion 36 by laminating semiconductor layers on a sapphire substrate 31, which includes a low temperature buffer layer 32 made of GaN or the like, an n-type layer 33 made of GaN or the like, an active layer (light emitting layer) 34 made of, for example, an InGaN based (which means that a ratio of In to Ga can be varied variously and the same applies hereinafter) compound semiconductor, which has a smaller band gap than that of the n-type layer 33 and decides a wavelength of emitted light, and a p-type layer 35 made of GaN or the like; providing a p-side (upper) electrode 38 on its surface interposing a light transmitting conductive layer 37; and providing an n-side electrode 39 on a surface of the n-type layer 33 exposed by etching a part of the semiconductor lamination portion 36. Additionally, a semiconductor layer having still larger band gap energy such as an AlGaN based (which means that a ratio of Al to Ga can be varied variously and the same applies hereinafter) compound or the like may be employed on an active layer side of the n-type layer 33 and the p-type layer 35 in order to increase an effect of carrier confinement.

On the other hand, nitride semiconductor also has a refractive index of approximately 2.5 far larger than 1, which is that of air, as other compound semiconductors have. Therefore, since light generated in the light emitting layer of the nitride semiconductor layer easily reflects totally when radiating from the semiconductor lamination portion to air, much of the light is not taken out of the semiconductor lamination portion, but is apt to repeat total reflection and attenuates within the semiconductor lamination portion, and as a result, efficiency of taking light out becomes remarkably low such as an order of 10%. Then, there has been used a method for taking out light easily such that, for example, concaves and convexes are formed by etching the outermost surface of the p-type layer by dry etching into a shape of semi-cylinders each of which has a cross-sectional view of a semicircle (cf. for example PATENT DOCUMENT 1).

PATENT DOCUMENT 1: Japanese Patent Application Laid-Open No. 2000-196152

DISCLOSURE OF THE INVENTION

Problem to be Solved by the Present Invention

As described above, also in nitride semiconductor light emitting devices, the idea of providing unevenness at a surface side in order to improve efficiency of taking out light has been used similarly to other compound semiconductor light emitting devices. However, since nitride semiconductor is chemically stable, the unevenness can not be formed on a surface of a nitride semiconductor layer by wet etching. Therefore, a dry etching method such as RIE has been tried as described above.

However, since crystallinity of the p-type layer made of nitride semiconductor is especially inferior, when a surface thereof is etched by dry etching or the like, the crystallinity of not only an interface thereof but also an inside of the p-type layer deteriorates more by an impact of dry etching, thereby a serial resistance increases and a defect having energy levels which absorbs light occurs at the interface, then, there arise problems such that a light emitting characteristics is lowered and a life time is shortened.

The present invention is directed to solve the above-described problems and an object of the present invention is to provide a nitride semiconductor light emitting device having a structure capable of improving external quantum efficiency by taking out light effectively by inhibiting attenuation of light emitted in the light emitting layer caused by repetition of total reflection in the semiconductor lamination portion and the substrate, and to provide a method for manufacturing the same.

Means for Solving the Problem

A semiconductor light emitting device according to the present invention includes: a substrate; a semiconductor lamination portion made of nitride semiconductor which is provided on one surface of the substrate, and formed by laminating an n-type layer and a p-type layer so as to form a light emitting layer; a light transmitting conductive layer provided at a surface side of the semiconductor lamination portion; a first electrode provided on the light transmitting conductive layer so as to be electrically connected to a conductivity type layer of the surface side of the semiconductor lamination portion; and a second electrode provided so as to be electrically connected to a conductivity type layer of a lower layer side of the semiconductor lamination portion, wherein a plurality of concaves are formed so as to leave a part of the light transmitting conductive layer on a bottom surface of each of the concaves, thereby a concave-convex pattern is formed on the surface of the light transmitting conductive layer.

More concretely, concaves are formed in the light transmitting conductive layer, the light transmitting conductive layer is left just under the concaves of the light transmitting conductive layer, and a plurality of the concaves are formed so that the entire light transmitting conductive layer is connected together with portions of the light transmitting conductive layer where concaves are not formed, thereby a concave-convex pattern is formed on a surface of the light transmitting conductive layer.

Here, the nitride semiconductor means a compound of Ga of group III element and N of group V element or a compound (nitride) in which a part or all of Ga of group III element substituted by other element of group III element like Al, In or the like and/or a part of N of group V element substituted by other element of group V element like P, As or the like. In addition, the light transmissivity means that 80% or more of light of a wavelength of the emitted light is transmitted.

It is preferable that the light transmitting conductive layer and the concaves are formed so that a thickness of the light transmitting conductive layer which is left under the concaves is 0.05 μm or more and a depth of each of the concaves is 0.1 to 10 μm.

From the view point of the efficiency of taking out light, it is preferable that an insulating layer having a smaller refractive index than that of the light transmitting conductive layer is provided on convexes of the concave-convex pattern so as to match to a pattern of the convexes, thereby a step difference of the concave-convex pattern is formed large.

A passivation film is provided on a surface of the concave-convex pattern, and a film thickness of the passivation film is set to 1 μm or less, thereby while a device is protected by the passivation film, the concaves and convexes can be left as it is without being flattened by the passivation film and efficiency of taking out light can be maintained high. More exactly, the passivation film is preferably thick so that openings (concave) are left on the surface of the passivation film on the concaves. If the concaves do not exist, the efficiency of taking out light is lowered. Namely, by setting the film thickness to w/2 or less, wherein the w is a width (diameter in case of a circle shape) of each of the concaves, the concaves are not filled perfectly with the passivation film, and the concaves are left on the surface of the passivation film.

The efficiency of taking light out is improved even in a structure such that a metal film made of Ag or Al is provided on almost entire surface of the concave-convex pattern through an insulating film and the semiconductor light emitting device is mounted so that a light taking out surface is the substrate side.

A method for manufacturing the semiconductor light emitting device according to the present invention includes the steps of: (a) forming a semiconductor lamination portion on a substrate by laminating an n-type layer and a p-type layer so as to form a light emitting layer; (b) forming a light transmitting conductive layer on a surface of the semiconductor lamination portion; (c) forming an insulating film on the light transmitting conductive layer; (d) forming a photo resist film on a surface of the insulating film and forming a pattern for forming concaves and convexes; (e) patterning the insulating film by using the photo resist film for a mask; and (f) forming a concave-convex pattern on the light transmitting conductive layer by etching the light transmitting conductive layer by using the insulating film for a mask.

Effect of the Invention

According to the semiconductor light emitting device, a concave-convex pattern is formed on the light transmitting conductive layer provided on a surface of the nitride semiconductor lamination portion. For the light transmitting conductive layer, for example, ZnO, ITO or the like which has a refractive index near that of nitride semiconductor layers may be used because they can be etched by wet etching. Moreover even in case of etching by dry etching, the etching can be carried out chemically and, at the same time, without any impact to the nitride semiconductor layer, because dry etching is not carried out directly to the nitride semiconductor layer but carried out within the light transmitting conductive layer. Therefore, concaves and convexes can be formed very easily on the surface, light emitted in the semiconductor lamination portion or light reflected from inside of the semiconductor lamination portion enters the light transmitting conductive layer having a refractive index near that of the nitride semiconductor layers, and an incident angle of the light is changed at the concaves and convexes, thereby the light becomes to be emitted easily. As a result, efficiency of taking out light is improved and external quantum efficiency can be significantly improved.

In addition, in case of ZnO, ITO or the like, it takes a long time to form a film because the film is formed by a sputtering method or a vapor deposition method and it leads to raising a manufacturing cost to form a thick film. However, by providing an insulating film on the convexes of the light transmitting conductive layer, a thick film can be formed in a short time and tall convexes can be easily formed because the film can be easily formed by a spin-coating method in case of the insulating film. Moreover, by providing an insulating film made of a material having a smaller refractive index than that of the light transmitting conductive layer, even if total reflection becomes apt to occur accompanied with lowering of the refractive index from the light transmitting conductive layer to the insulating film, since the reflected light travels to a side wall of the convexes, the light becomes to be emitted easily outside by changing the incident angle. On the other hand, light entering the insulating film can be taken out more easily because the difference between the refractive indices of the insulating film and outside becomes small. As a result, the external quantum efficiency can be improved.

BRIEF DESCRIPTION OF THE DRAWINGS

FIG. 4 is a figure showing a simulated result of a variation of luminance obtained when a size of the convex is varied in the structure of FIG. 2.

EXPLANATION OF LETTERS AND NUMERALS

Figure 1:
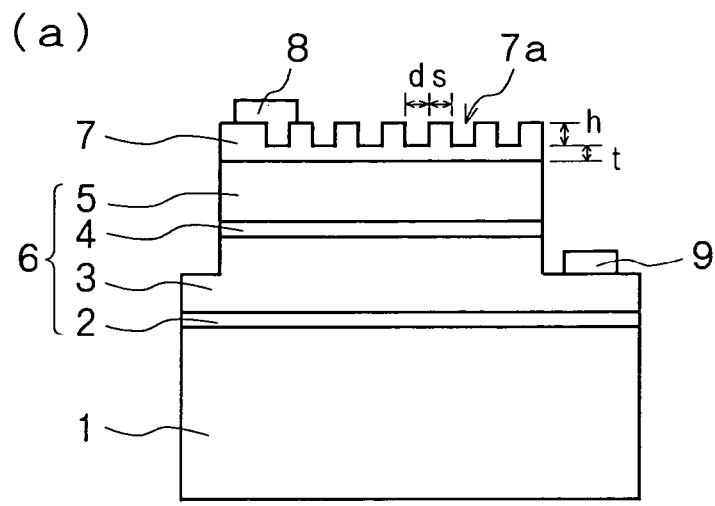
FIG. 1 is a cross-sectional view and a perspective view explaining an embodiment of the semiconductor light emitting device according to the present invention.
Figure 1:
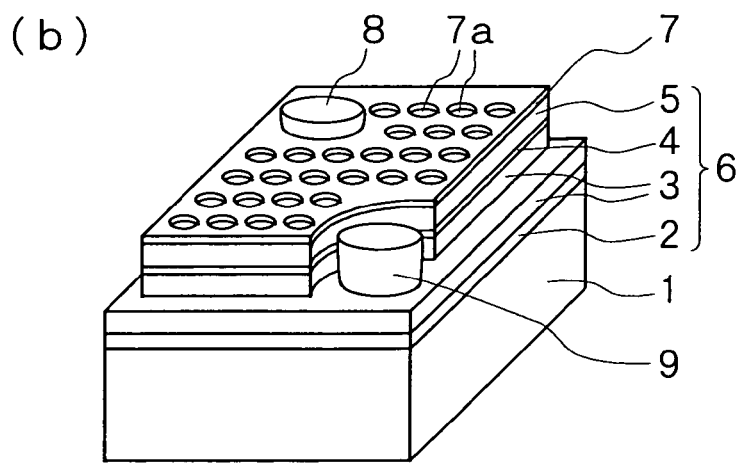

1: substrate
3: n-type layer
4: active layer
5: p-type layer
6: semiconductor lamination portion
7: light transmitting conductive layer
7*a*: concave
8: p-side electrode
9: n-side electrode
10: insulating film for forming concaves
11: passivation film
12: metal film
17: photo resist film
d: diameter of the concave
s: interval of the concave
h: depth of the concave
t: thickness of left portion of light transmitting conductive layer

THE BEST EMBODIMENT OF THE PRESENT INVENTION

An explanation will be given below of a semiconductor light emitting device according to the present invention and a method for manufacturing the same in reference to the drawings. As a cross-sectional view and a perspective view explaining an embodiment of the semiconductor light emitting device according to the present invention are shown in FIG. 1, a semiconductor lamination portion 6 is formed by laminating nitride semiconductor layers including an n-type layer 3 and a p-type layer 5 on one side of a substrate 1 made of, for example, sapphire, so as to form a light emitting layer, and a light transmitting conductive layer 7 is provided at a surface side of the semiconductor lamination portion 6. On the light transmitting conductive layer 7, a first electrode, namely a p-side electrode 8 in the example shown in FIG. 1, is provided so as to be electrically connected to a conductivity type layer of the surface side of the semiconductor lamination portion 6, namely the p-type layer 5 in the example shown in FIG. 1, and a second electrode, namely an n-side electrode 9, is provided so as to be electrically connected to a conductivity type layer of a lower layer side of the semiconductor lamination portion 6, namely an n-type layer exposed by etching a part of the semiconductor lamination portion 6 in the example shown in FIG. 1. The present invention is characterized in forming a concave-convex pattern (concaves 7a in the example shown in FIG. 1) on a surface of the light transmitting conductive layer 7.

In the example shown in FIG. 1, a ZnO layer doped with Ga is provided with a thickness of approximately 1 to 5 μm as the light transmitting conductive layer 7. The light transmitting conductive layer 7 made of ZnO can be formed, for example, by a sputtering method, a pulse laser deposition (PLD) or the like using ZnO doped with Ga for a target, or by a vapor deposition method or the like such as a MBE method. The light transmitting conductive layer 7 is called a light transmitting electrode, provided to diffuse electric current to an entire chip while transmitting light emitted in the light emitting layer, since a carrier concentration of the p-type layer can not be increased so high, and formed so that a specific resistance thereof is approximately $5\times10^{-4}\Omega\cdot cm$. The light transmitting conductive layer 7 is formed by using a material which can obtain an ohmic contact with the p-type layer 5. In order to form concaves and convexes on the light transmitting conductive layer 7, after forming a mask made with a photo resist film, an insulating film or the like on the surface, in case of wet etching, by etching using an etchant such as hydrochloric acid, phosphoric acid or the like and in case of dry etching, by etching under an atmosphere of chlorine group gas, etching can be carried out so as to match a shape of openings of the mask.

A shape of the concaves and convexes is not limited to circular, quadrilateral or the like, and forming convexes or forming concaves can be allowed. However, the concaves, each of which has a circular shape or a rectangular shape in a plan view are preferable since a thick layer of the light transmitting conductive layer 7 is continuously formed on the surface of the semiconductor lamination portion 6 and the electric current can be easily diffused in the entire area of the chip. Since the light transmitting conductive layer 7 has functions by which an ohmic contact with the nitride semiconductor layer is formed as described above and the electric current is diffused in the entire area of the chip as an electrode, considering these functions and further considering inhibiting raising a manufacturing cost caused by a long film-forming time, the concaves 7a are formed.

Concretely, for example, a concave 7a is formed in which a plan shape is circular and a diameter d of the concave 7a is approximately 1 to 10 μm, preferably 3 to 7 μm. If an interval s of the concaves 7a is too large, the effect of taking out light is lowered because the number of concaves 7a decreases, and if it is too small, the electric current cannot be diffused sufficiently, then the concaves are formed with an interval of 1 to 10 μm, preferably approximately 3 to 7 μm. If a depth h of the concave 7a is too large, the light transmitting conductive layer 7 is required to be formed thick and a manufacturing cost is raised because time for film-forming and etching becomes longer, and if it is too small, the effect of taking out light is reduced, and then the concaves are formed with the depth of 0.1 to 10 μm, preferably 0.2 to 5 μm, more preferably 1 to 4 μm. If a thickness t of a left portion of the light transmitting conductive layer 7 of a portion where the concave 7a is formed is too small, a resistance becomes high, the electric current cannot be diffused sufficiently, and light emitted under the concave 7a is weakened, and if it is too large, the film-forming time becomes longer corresponding to the depth h of the concave 7a, and then the concaves are formed so as to leave a light transmitting conductive layer 7 with a thickness t of 0.05 μm or more, preferably approximately 0.05 to 0.5 μm. Namely, it is desirable that the light transmitting conductive layer 7 is formed with a thickness of at least 0.05 μm or more so as to connect continuously on the entire surface of the p-type layer 5. In addition, as even if light is emitted under the p-side electrode or the like, it cannot be taken out because of being intercepted by the p-side electrode, it is preferable that light is not emitted. In the case that light emitting is not required or light emitting is not necessary, a structure may be used in which the light transmitting conductive layer 7 is etched so as not to be left and expose the p-type layer 5. The concave 7a may be reversely substituted by a convex. A result of a variation of measuring of the luminance obtained when the diameter and the depth h of the concave 7a and the convex are varied will be described later.

For example, by forming a concave in the light transmitting conductive layer 7 so as to expose the semiconductor lamination portion 6 (p-type layer 5), the ohmic contact of the p-side electrode 8 and the p-type layer 5 cannot be obtained and light is hardly emitted because it is hard for the electric current to flow, thereby useless light emitted in a portion where light is intercepted by the p-side electrode 8 can be inhibited. As described above, the concaves may be formed so that the light transmitting conductive layer 7 is left in order to be connected on the entire surface, or so that the light transmitting conductive layer is not left at all of the concaves, or so that the light transmitting conductive layer 7 is not left at one part of the concaves and is left at the other part of the concaves.

The semiconductor lamination portion 6 is formed, for example, in a structure described below. There are laminated following layers in order respectively; a low temperature buffer layer 2 made of, for example, GaN and having a thickness of approximately 0.005 to 0.1 μm, the n-type layer 3 made of GaN doped with Si or AlGaN based compound and having a thickness of approximately 1 to 10 μm, an active layer 4, having a structure of a multiple quantum well (MQW), formed in a thickness of approximately 0.05 to 0.3 μm, by laminating 3 to 8 pairs of well layers made of $In_{0.13}Ga_{0.87}N$ and having a thickness of 1 to 3 nm, and barrier layers made of GaN and having a thickness of 10 to 20 nm, and the p-type layer 5 made of p-type GaN or AlGaN based compound semiconductor and having a thickness of approximately 0.2 to 1 μm.

Although, the n-type layer 3 and the p-type layer 5 are composed of one layer respectively in the example shown in FIG. 1, multiple layers may be formed of, for example, a barrier layer (a layer with a large band gap energy), which confines carrier easily, made of AlGaN based compound and formed at the active layer side of the n-type layer 3 and the p-type layer 5, and a contact layer, which raises carrier density easily, made of GaN and formed at an opposite side of the active layer 4, furthermore, other layers such as a high temperature buffer layer undoped, n-typed or the like, a super lattice layer releasing strains between each layer, or the like, may be interposed on the low temperature buffer layer. And these layers may be formed by other nitride semiconductor layer. Although, in this example, a double hetero structure is shown in which the active layer 4 is sandwiched by the n-type layer 3 and the p-type layer 5, a structure of a p-n junction can be used in which the n-type layer and the p-type layer are directly joined with a hetero junction. And the active layer 4 is not limited to the MQW structure described above, a single quantum well structure (SQW) or a bulk structure can be employed.

Then, the n-side electrode 9 for ohmic contact is formed on the n-type layer 3 exposed by etching and removing a part of the semiconductor lamination portion 6 as an alloy layer formed by sintering laminated layers of a Ti film of a thickness of approximately 0.01 μm and an Al film of a thickness of approximately 0.25 μm, at a temperature of approximately 600° C., and the p-side electrode 8 is formed on a part of the light transmitting conductive layer 7, by a lamination structure of a Ti film of a thickness of approximately 0.1 μm and an Au film of a thickness of approximately 0.3 μm. A passivation film (not shown in figures) made of SiN, $SiO_2$ or the like is provided on the whole surface except the surface of the p-side electrode 8 and the n-side electrode 9. Since, if a thickness of the passivation film is too large, the concave is filled and the efficiency of taking out light is lowered, it is preferably set to w/2 or less so as to leave a concave portion within the concave, wherein the w is a width of the concave (diameter in case of a concave of a circle shape). Concretely, it is preferable to be 1 μm or less.

In the example shown in FIG. 1, the concaves and convexes are formed by etching the light transmitting conductive layer 7 directly using a photo resist mask or the like, however, while the concaves and convexes having a large depth are superior in efficiency of taking light out, it takes a long time to form a thick film because the film is formed by a sputtering method, a vapor deposition method or the like as described above. In addition, if etching is carried out by forming a photo resist directly on a ZnO layer or the like, under-etching which reaches under side of the photo resist film is apt to occur, and, as a result, etching with an accurate pattern can be hardly carried out. In addition, since a refractive index of the ZnO is approximately 2.2 and comparatively near that of GaN of approximately 2.5, light from the semiconductor lamination portion 6 can enter the convex 7a easily, however, at the time when the light is emitted outside from the convex, since the difference with a refractive index 1 of the air is large, the light is apt to be totally reflected. Therefore, on the convex being left at the surrounding of the concave 7a previously formed, a layer is preferably provided which has an intermediate refractive index of the refractive index of the light transmitting conductive layer 7 and that of the air because the light can be more easily taken out. From this view point, there is shown an example in which, for example, an insulating film 10 such as $SiO_2$ (refractive index of approximately 1.4) or the like is provided on the surrounding (convex) of the concave 7a, in FIG. 2 by a cross-sectional view same as FIG. 1(a).

Figure 2:
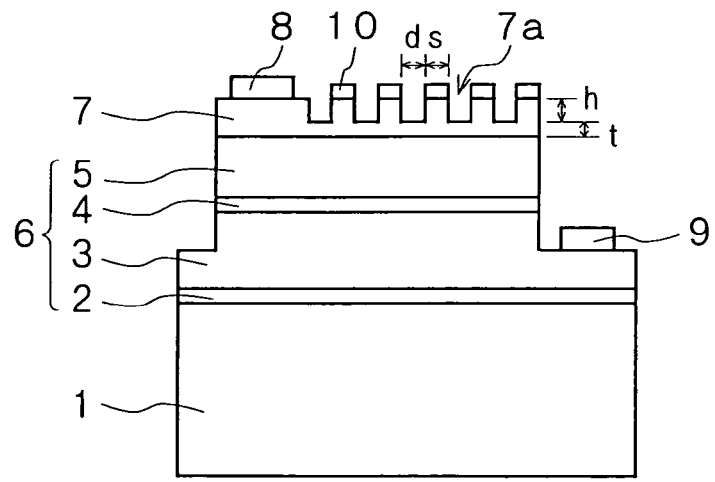
FIG. 2 is a cross-sectional view explaining another embodiment of the semiconductor light emitting device according to the present invention.

A difference of FIG. 2 from FIG. 1 is that a film made of a material having a smaller refractive index than that of the light transmitting conductive layer 7, for example, such as $SiO_2$, $Si_3N_4$ (refractive index of approximately 1.9) or the like is provided on a surrounding (convex) of the concave 7a, and the other structure is same as that shown in FIG. 1. Namely, since under-etching is apt to occur when etching is carried out by forming a photo resist film directly on the light transmitting conductive layer 7 made of ZnO as described above, an insulating film 10 made of $SiO_2$ or the like on the surface of the light transmitting conductive layer 7 is formed by a SOG method (coating insulating powder dissolved in a solvent on the surface by rotating and removing the solvent by heating), the insulating film 10 is firstly patterned by providing a photo resist film on the insulating film 10, the light transmitting conductive layer 7 is etched by using the patterned insulating film 10 for a mask, and the insulating film 10 is left as it is.

Figure 3:
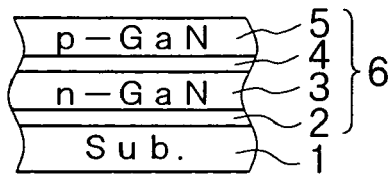
FIG. 3 is a figure showing a manufacturing process for the semiconductor light emitting device of FIG. 2.
Figure 3:
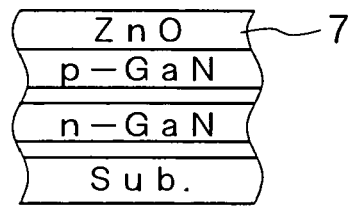
Figure 3:
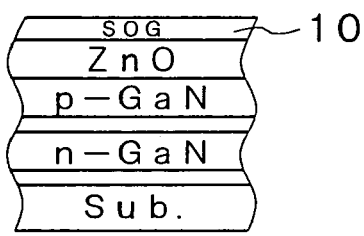
Figure 3:
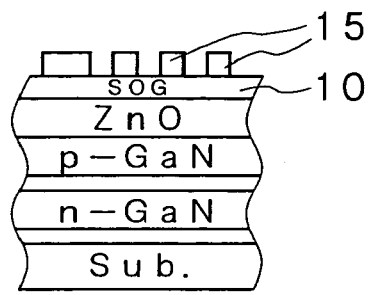
Figure 3:
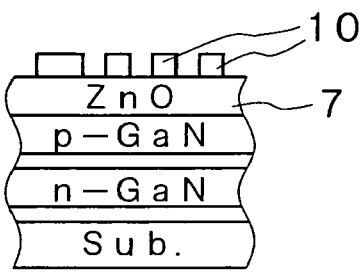
Figure 3:
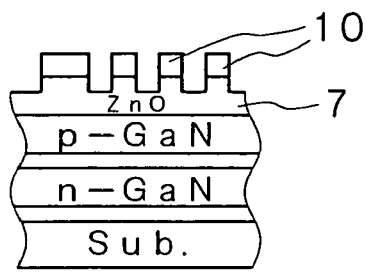
Figure 3:
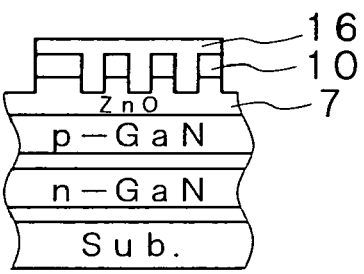
Figure 3:
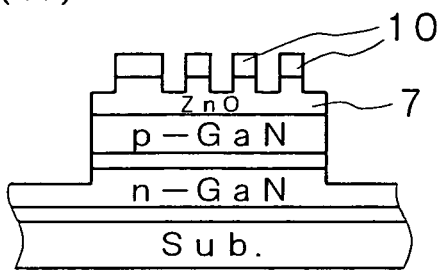
Figure 3:
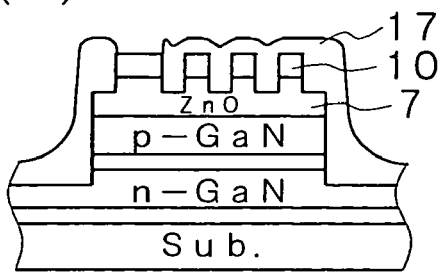
Figure 3:
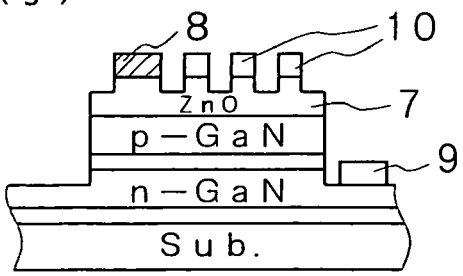

And next, an explanation of a method for manufacturing the semiconductor light emitting device shown in FIG. 2 will be given below in reference of an explanatory figure of a manufacturing process in FIG. 3. Firstly, the nitride semiconductor layers 1 to 5 are laminated as shown in FIG. 3(a). The semiconductor lamination portion is formed by a method of metal organic chemical vapor deposition (MOCVD), supplying necessary gasses such as a reactant gas like trimethyl gallium (TMG), ammonia ($NH_3$), trimethyl aluminium (TMA), trimethyl indium (TMIn) or the like, and a dopant gas like $SiH_4$ for making an n-type, or a dopant gas like cyclopentadienyl magnesium ($Cp_2Mg$), dimethyl zinc (DMZn) or the like for making a p-type.

At first, the low temperature buffer layer 2 made of a GaN layer is formed on an insulating substrate 1 made of, for example sapphire, in a thickness of approximately 0.005 to 0.1 μm, at a low temperature of, for example, approximately 400 to 600° C., thereafter, the n-type layer (barrier layer) 3 made of n-type GaN is formed in a thickness of approximately 1 to 10 μm by raising a temperature to a high temperature of approximately 600 to 1200° C. And at a lowered temperature of 400 to 600° C., the active layer 4 is formed which has a structure of a multiple quantum well (MQW) formed in a thickness of approximately 0.05 to 0.3 μm by laminating 3 to 8 pairs of well layers made of, for example, $In_{0.13}Ga_{0.87}N$ and having a thickness of 1 to 3 nm, and barrier layers made of GaN and having a thickness of 10 to 20 nm. And, the p-type layer 5 made of GaN is laminated 0.2 to 1 μm thick in total by raising a temperature in a growth furnace to approximately 950 to 1,100° C.

Thereafter, a protection film made of SiN or the like is provided on the surface, annealing is carried out at a temperature of approximately 400 to 800 for approximately 10 to 60 min in order to activate the p-type dopant, and, as shown in FIG. 3(b), the light transmitting conductive layer 7 is formed with a thickness of approximately 0.7 to 10 μm by forming the ZnO film by a sputtering method or the like. In addition, on the surface thereof, the insulating film 10 is formed with a thickness of approximately 0.1 to 10 μm, for example, by a SOG method. Then, as shown in FIG. 3(d), a photo resist film is formed on a surface thereof, and a mask 15 is formed by patterning so as to match to the concave-convex pattern by a photolithography method. And, as shown in FIG. 3(e), by dry etching such as, for example, a RIE method or the like, the insulating film 10 exposed from the mask 15 is etched, thereafter the mask 15 is removed. Subsequently, as shown in FIG. 3(f), the light transmitting conductive layer 7 exposed from the insulating film 10 is etched so as to be left with a thickness of approximately 0.05 μm or more by using the insulating film 10 for a mask and by a ICP etching method using a chlorine group gas.

Thereafter, as shown in FIG. 3(g), by providing a photo resist film 16 on the entire surface and patterning it by a photolithography process, a part (surrounding region of a chip and region for forming the n-side electrode) of the semiconductor lamination portion 6 and the light transmitting conductive layer, which are to be etched, is exposed and etched, as shown in FIG. 3(h), by supplying chlorine gas and silicon tetrachloride gas, and applying a RF power. As a result, the n-type layer 3 is exposed by etching parts of the semiconductor lamination portion 6, which are exposed not covered by the mask, at a surrounding region of a chip and a region for forming the n-side electrode 9. Then, the photo resist film 16 is removed.

Subsequently, as shown in FIG. 3(i), a photo resist film 17 is formed on the entire surface again and an opening is formed at a place for forming the p-side electrode 8. Then, the light transmitting conductive layer 7 is exposed by removing an exposed part of the insulating film 10 by etching, and subsequently, the p-side electrode 8 is formed by forming a Ti film having a thickness of 0.1 μm and a Au film having a thickness of 0.3 μm by a lift-off method. In addition, on the exposed surface of the n-type layer 3 formed by the above-described etching, a Ti film having a thickness of 0.01 μm and an Al film having a thickness of 0.25 μm are formed by the lift-off method, and by sintering to make an alloy by applying a heat treatment of approximately 600° C., the n-side electrode 9 is formed. And, by dividing a wafer into chips, the LED chip having a structure shown in FIG. 2 is formed.

A result of measuring luminance of right above in the structure shown in FIG. 2 obtained when a size (diameter) of the concave 7a is varied is shown in FIG. 4. Namely, in FIG. 4, there are shown cases of case A (conventional structure) having no concaves, case B having concaves with a diameter d of the concave 7a of 2 μm and an interval s of the concave 7a of 2 μm, case C having concaves with a diameter d of the concave 7a of 5 μm and an interval s of the concave 7a of 2 μm, and case D having concaves with a diameter d of the concave 7a of 10 μm and an interval s of the concave 7a of 4 μm. In addition, in all cases, a thickness of the ZnO film 7 is 0.75 μm, an etching depth of the ZnO film 7 is 0.7 μm, and a thickness of the insulating film 10 is 0.18 μm. From FIG. 4, it is understood that the luminance is highest when the diameter is 5 μm and is rather lowered when the diameter becomes large to approximately 10 μm. Namely, it is found that the size of the pattern is preferably approximately 3 to 10 μm. In addition, even if the interval s is approximately 1 μm, since it is a convex, it is not filled by the insulating layer 10, the luminance of the same level as that of a case of 2 μm can be obtained, and the interval may be approximately 1 to 10 μm, preferably approximately 3 to 7 μm. On the other hand, it can be understood that, comparing to the conventional case A in which the concaves and convexes are not formed, the luminance is improved in any size. In addition, the luminance obtained when the passivation film is formed on the entire surface with a SiN film is measured, and a variation of the luminance caused by the passivation film is within a measurement error and can be hardly observed. However, when the concave is low like approximately 2 μm, the diameter d is also small like approximately 1 μm, and the concave is filled with the passivation film, improvement of the luminance can be hardly observed.

Figure 5:
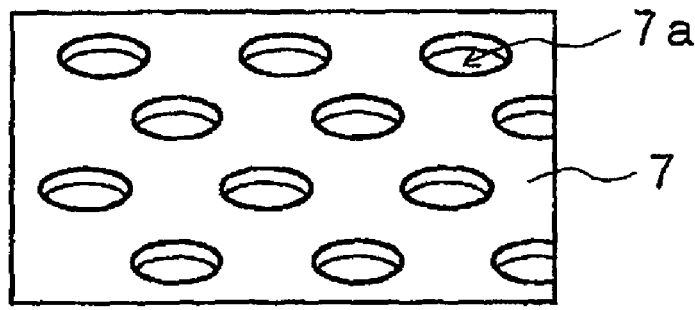
FIG. 5 is a figure showing a simulated result of a variation of luminance to a depth of the concave in the example of forming the concaves in the light transmitting conductive layer.
Figure 5:
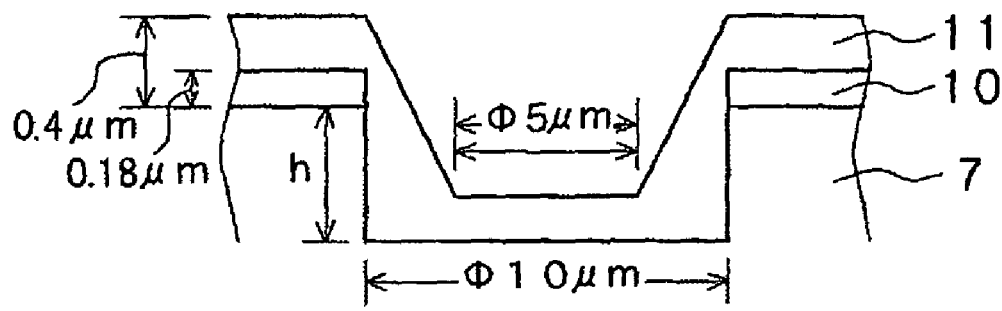
Figure 5:
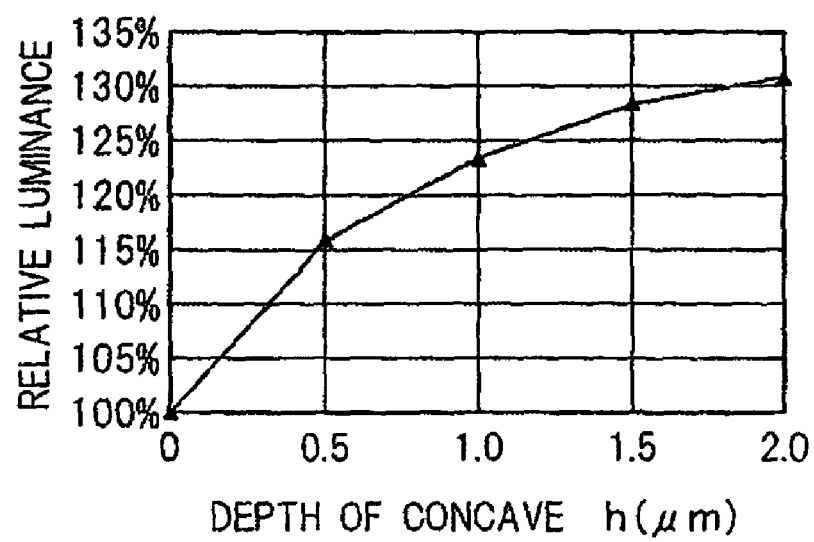

A simulated result of variation of the luminance due to a depth of the concave and convex is similarly shown in FIG. 5(c). The simulated result is a data obtained in the example in which, as shown in FIG. 5(a), the diameter of the concave 7a provided in the light transmitting conductive layer 7 is set to approximately 10 μm, the interval s approximately 4 μm, and, furthermore, a passivation film 11 is provided on the surface as an enlarged explanatory cross-sectional view of one concave 7a is shown in FIG. 5(b). In addition, here, the thickness of the ZnO film 7 is a constant value of 2.2 μm and only the depth of the concave 7a is varied. Obviously from FIG. 5(c), it is understood that the luminance is improved accompanied with increasing of the depth of the concave 7a.

As described above, according to the present invention, since the concaves and convexes are formed by forming the concaves and the convexes not on the surface of the nitride semiconductor layer but on the surface of the light transmitting conductive layer 7 provided thereon, the concaves and the convexes can be formed on the surface by very easy etching, and, at the same time, since dry etching of hard nitride semiconductor is not necessary, the nitride semiconductor layer such as the p-type layer or the like is prevented from a damage. Therefore, not only a manufacturing process becomes very simple, but also the luminance is significantly improved because no damage to the semiconductor layers occurs.

In addition, as described above, the deeper the depth of the concaves and convexes is, the more the luminance is improved, however, since the light transmitting conductive layer 7 is formed by a sputtering method or a vapor deposition method as described above, it takes long time to form a thick film and a manufacturing cost is raised. However, as shown in FIG. 2, by forming the insulating film 10 made of $SiO_2$ or the like on the light transmitting conductive layer 7 and using it for a mask for patterning the light transmitting conductive layer, a very thick film can be formed very easily because the insulating film can be easily formed by a SOG method or a CVD method. Furthermore, since the refractive index of the $SiO_2$ is approximately 1.4 to 1.5 and relatively smaller than that of ZnO which is approximately 2.2, the $SiO_2$ is preferable because light can be more easily taken out from the convexes. In such manner, by providing a layer having a smaller refractive index than that of the light transmitting conductive layer 7 on the light transmitting conductive layer 7, and by using a material which can be used for a mask of the light transmitting conductive layer 7, a height of the convexes increases, thereby light can be more easily taken out in a relationship with the refractive index, and since contactness of the light transmitting conductive layer 7 and the mask is superior, patterning of the light transmitting conductive layer 7 can be formed with a desired pattern.

Figure 6:
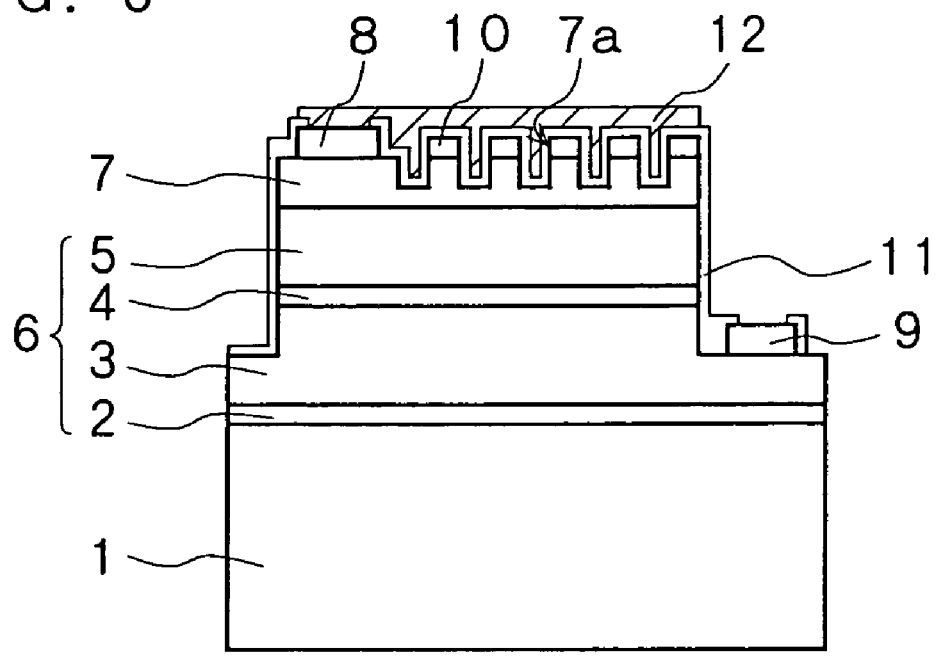
FIG. 6 is a cross-sectional view explaining an example in which a light taking out surface is a substrate side in the structure shown in FIG. 1.
Figure 7:
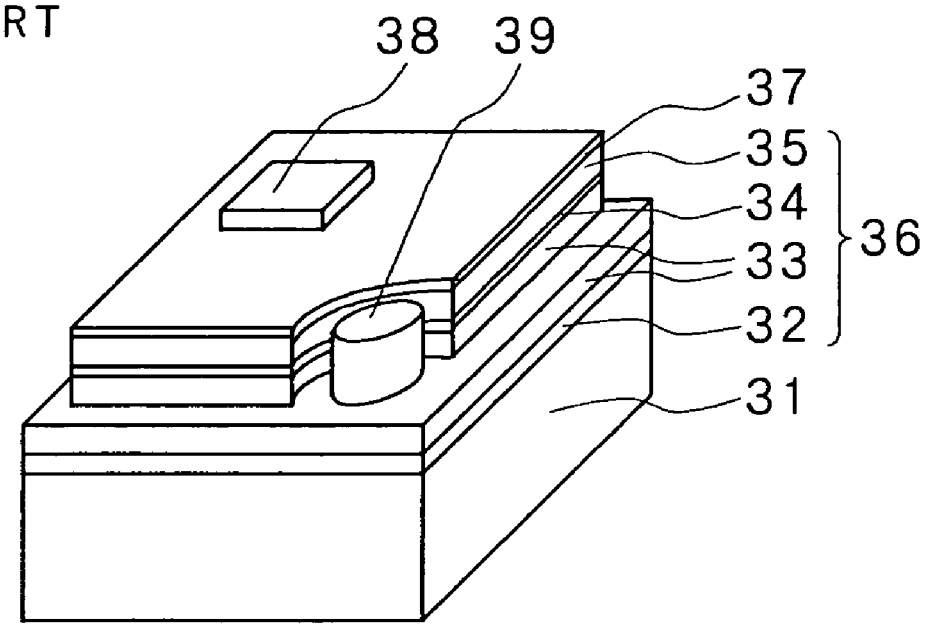
FIG. 7 is a perspective view explaining a LED by the prior art, using nitride semiconductor.

FIG. 6 is an explanatory cross-sectional view of another embodiment of the present invention. Namely, the above-described concaves and convexes are preferably formed on a surface of taking out light, however, even in case of flip-chip mounting in which an upper surface side of the semiconductor lamination portion is a mounting side and light is taken out from the substrate side, it is found that the luminance can be improved by forming the concaves and convexes in the light transmitting conductive layer 7. Namely, in FIG. 6, a structure, in which the convexes 7a are formed in the light transmitting conductive layer 7, the insulating film 10 is provided on the convexes 7a, and a surface thereof is covered by the passivation film 11, is same as that described above, however, in this embodiment, the surface where the concaves and convexes are formed is not the light taking out surface, and a metal film 12 made of, for example, Ag or Al is provided on the almost entire area of the surface so as to connect to the p-side electrode 8. In such manner, even if the surface is covered by the metal film 12, by providing the convexes 7a, since light is apt to be taken out from the convexes 7a and a path is different from a path of repeated reflection in the semiconductor lamination portion, it becomes easy for the light to be taken out even if light is reflected by the metal film 12 and returns in the semiconductor lamination portion 6 again. Of course, if the concaves and convexes are formed on a back surface of the substrate made of sapphire, the efficiency of taking light out is improved more. In FIG. 6, the same letters and numerals are attached to the same parts as those of the above-described example and the explanation is omitted.

Further, in the above-described example, since a sapphire substrate of an insulating substrate is used for the substrate, the n-type layer 3 is exposed by etching a part of the semiconductor lamination portion 6 in order to form the n-side electrode 9, however, even in case of a semiconductor substrate such as SiC, similarly by forming the concaves and convexes on the surface of the light transmitting conductive layer 7 provided on the surface of the semiconductor lamination portion 6, the efficiency of taking light out can be improved in the same manner. In addition, the structure of the semiconductor lamination portion or the like is same as that of the above-described example and the explanation is omitted.

INDUSTRIAL APPLICABILITY

The light emitting device by the present invention can be used for back lights for liquid crystal display devices or the like, light sources of every kinds, traffic signals or lighting devices for replacing electric lamps or the like, and electronic appliance of every kinds.

What is claimed is:

1. A semiconductor light emitting device comprising:
 a substrate;
 a semiconductor lamination portion made of nitride semiconductor that is provided on one surface of the substrate, and formed by laminating an n-type layer and a p-type layer so as to form a light-emitting layer;
 a light transmitting conductive layer with a plurality of concaves on a surface provided at a surface side of the semiconductor lamination portion, wherein the light transmitting conductive layer and the concaves are formed so that a thickness of the light transmitting conductive layer which is left under the concaves is 0.05 μm or more and a depth of each of the concaves is 2 μm to 10 μm, thereby a concave-convex pattern is formed on the surface of the light transmitting conductive layer;
 a first electrode provided on the light transmitting conductive layer so as to be electrically connected to a conductivity type layer of the surface side of the semiconductor lamination portion; and
 a second electrode provided so as to be electrically connected to a conductivity type layer of a lower layer side of the semiconductor lamination portion,
 wherein the plurality of concaves are formed so as to leave a part of the light transmitting conductive layer on a bottom surface of each of the concaves, thereby a concave-convex pattern is formed on the surface of the light transmitting conductive layer,
 an insulating layer having a smaller refractive index than that of the light transmitting conductive layer provided on convexes of the concave-convex pattern so as to match to a pattern of the convexes, thereby forming a large step difference in the concave-convex pattern, and
 a passivation film provided on an entire surface of the concave-convex pattern so as not to fill up the concaves with the passivation film,
 wherein a plan view of each of the concaves is circular, a diameter of each of the concaves is 3 μm to 10 μm, and a minimum interval between each of the concaves is 3 μm to 10 μm.

2. The semiconductor light emitting device according to claim 1, wherein the diameter of each of the concaves is 5 μm to 10 μm, and the minimum interval between each of the concaves is 5 μm to 10 μm.

3. The semiconductor light emitting device according to claim 1, wherein a film thickness of the passivation film is set to 1 μm or less.

4. The semiconductor light emitting device according to claim 3, wherein a metal film made of Ag or Al is provided on almost the entire surface of the concave-convex pattern through an insulating film and the semiconductor light emitting device is mounted so that a light taking out surface is a substrate side.

5. The semiconductor light emitting device according to claim 1, wherein a metal film made of Ag or Al is provided on almost the entire surface of the concave-convex pattern through an insulating film and the semiconductor light emitting device is mounted so that a light taking out surface is a substrate side.

6. The semiconductor light emitting device according to claim 1, wherein the first electrode is provided in contact with the p-type layer of the semiconductor lamination portion which is the conductivity type layer of the surface side, by forming at least one concave such that the light transmitting conductive layer is not left in the concave.

7. A method for manufacturing a semiconductor light emitting device comprising the steps of:
 (a) forming a semiconductor lamination portion on a substrate by laminating an n-type layer and a p-type layer so as to form a light emitting layer;
 (b) forming a light transmitting conductive layer on a surface of the semiconductor lamination portion;
 (c) forming an insulating film on the light transmitting conductive layer by a SOG method;
 (d) forming a photo resist film on a surface of the insulating film and forming a pattern for forming concaves and convexes;
 (e) patterning the insulating film by using the photo resist film for a mask;
 (f) forming a plurality of concaves on a surface of the light transmitting conductive layer so that a thickness of the light transmitting conductive layer which is left under the concaves is 0.05 μm or more and a depth of each of the concaves is 2 μm to 10 μm, wherein a plan view of each of the concaves is circular, a diameter of each of the concaves is 3 μm to 10 μm, and a minimum interval between each of the concaves is 3 μm to 10 μm, thereby a concave-convex pattern is formed on the surface of the light transmitting conductive layer, and after using the insulating film for the mask, the insulating film is left as it is; and
 (g) forming a passivation film on an entire surface of the concave-convex pattern so as not to fill the concaves with the passivation film.

\* \* \* \* \*